United States Patent
Mitsunaga

(10) Patent No.: US 10,962,572 B2
(45) Date of Patent: Mar. 30, 2021

(54) ISOLATED VOLTAGE PROBE

(71) Applicants: Yokogawa Electric Corporation, Tokyo (JP); YOKOGAWA TEST & MEASUREMENT CORPORATION, Tokyo (JP)

(72) Inventor: Katsuki Mitsunaga, Tokyo (JP)

(73) Assignees: Yokogawa Electric Corporation, Tokyo (JP); YOKOGAWA TEST & MEASUREMENT CORPORATION, Tokyo (JP)

( * ) Notice: Subject to any disclaimer, the term of this patent is extended or adjusted under 35 U.S.C. 154(b) by 310 days.

(21) Appl. No.: 15/588,843

(22) Filed: May 8, 2017

(65) Prior Publication Data
US 2017/0370967 A1    Dec. 28, 2017

(30) Foreign Application Priority Data
Jun. 23, 2016    (JP) .............................. JP2016-124386

(51) Int. Cl.
| | | |
|---|---|---|
| G01R 15/18 | (2006.01) | |
| G01R 1/07 | (2006.01) | |
| G01R 19/00 | (2006.01) | |
| G01R 1/067 | (2006.01) | |
| G01R 15/20 | (2006.01) | |

(52) U.S. Cl.
CPC .............. G01R 15/181 (2013.01); G01R 1/07 (2013.01); G01R 19/0084 (2013.01); *G01R 1/06766* (2013.01); *G01R 15/18* (2013.01); *G01R 15/20* (2013.01)

(58) Field of Classification Search
None
See application file for complete search history.

(56) References Cited

U.S. PATENT DOCUMENTS

| | | | | |
|---|---|---|---|---|
| 5,973,501 A  * | 10/1999 | Reichard | ................ | G01R 23/20 |
| | | | | 324/253 |
| 6,118,270 A  * | 9/2000 | Singer | .................. | G01R 15/181 |
| | | | | 324/115 |
| 7,679,162 B2 * | 3/2010 | Dupuis | ................ | G01R 15/181 |
| | | | | 257/531 |

(Continued)

FOREIGN PATENT DOCUMENTS

| | | |
|---|---|---|
| JP | 6-022217 Y2 | 6/1994 |
| JP | 06331657 A | 12/1994 |

(Continued)

OTHER PUBLICATIONS

"Voltmeter Configured to Measure Voltage with Hall Effect", Internet, <URL:https://detail.chiebukuro.yahoo.co.jp/qa/question_detail/q1242719602>, (Yahoo Answers in Japanese) (3 pages total) Retrieved May 7, 2018.

*Primary Examiner* — Paresh Patel
(74) *Attorney, Agent, or Firm* — Sughrue Mion, PLLC

(57) ABSTRACT

An isolated voltage probe includes: a conductor including a positive lead, a negative lead, and a resistance via which the positive lead and the negative lead are connected to each other; a magnetic sensor for measuring a magnetic field in a non-contact manner, the magnetic field being generated by a current flowing through the conductor; and a coaxial cable for transmitting a signal that is based on an output supplied from the magnetic sensor.

8 Claims, 3 Drawing Sheets

(56) References Cited

U.S. PATENT DOCUMENTS

| | | | | |
|---|---|---|---|---|
| 10,539,643 B2* | 1/2020 | Huber | | G01R 35/00 |
| 2003/0214313 A1* | 11/2003 | Omura | | G01R 19/0092 |
| | | | | 324/713 |
| 2009/0256580 A1* | 10/2009 | Heckleman | | G01R 15/181 |
| | | | | 324/654 |
| 2013/0082695 A1* | 4/2013 | Johnson | | G01R 15/207 |
| | | | | 324/243 |
| 2014/0049250 A1* | 2/2014 | Brown | | H05H 1/46 |
| | | | | 324/127 |
| 2016/0231364 A1* | 8/2016 | Nejatali | | H02J 7/025 |
| 2017/0168094 A1* | 6/2017 | Chikamatsu | | G01R 15/146 |
| 2018/0306840 A1* | 10/2018 | Peschke | | G01R 1/06766 |

FOREIGN PATENT DOCUMENTS

| | | | | |
|---|---|---|---|---|
| JP | 07113822 A | | 5/1995 | |
| JP | 2015206596 A | | 11/2015 | |
| JP | 2017227552 A | * | 12/2017 | G01R 1/07 |

* cited by examiner

ISOLATED VOLTAGE PROBE

CROSS-REFERENCE TO RELATED APPLICATION

This application claims priority from Japanese Patent Application No. 2016-124386 filed with the Japan Patent Office on Jun. 23, 2016, the entire content of which is hereby incorporated by reference.

BACKGROUND

1. Technical Field

The present disclosure relates to an isolated voltage probe.

2. Description of the Related Art

As one method for ensuring safety in a voltage measurement performed on high voltage equipment or the like, there has been an isolated voltage measurement. According to the isolated voltage measurement, it is possible to perform a measurement safely even with a measurement object and a measuring instrument having different ground potentials. Namely, even if the measurement object that is isolated (floating) from an earth ground is at a high voltage level, safety is kept for the measuring instrument that is grounded. Furthermore, according to the isolated voltage measurement, a ground loop between the measurement object and the measuring instrument is cut, thereby removing a noise caused by ground impedance.

One parameter indicative of the isolation performance is an isolation mode rejection ratio (IMRR). IMRR is an important indicator indicative of a degree of isolation with respect to a frequency. IMRR is defined by a proportion of an output amplitude with respect to an input amplitude, observed when identical signals are applied to a positive input terminal and a negative input terminal.

When the identical signals are applied to the positive input terminal and the negative input terminal, an output signal is ideally zero. Actually, however, an effect of the input signal appears in the output signal. IMRR shows a degree of the effect.

For the isolated voltage measurement, the measuring instrument often includes an isolated circuit. Representative examples of the type of the isolated circuit encompass an optical coupling type involving use of a photocoupler, a magnetic coupling type involving use of a transformer and/or the like, and a capacitive coupling type involving use of a capacitor.

With any of the isolated circuit types, for the isolated voltage measurement, a voltage probe is used to pick up a signal and transmit the signal to the measuring instrument. For example, the voltage probe has a configuration as those shown in FIG. 4.

As shown in FIG. 4, a voltage probe 400 includes a probe head 401, a coaxial cable 402, and a connector 403. The voltage probe 400 does not include an isolated circuit. Thus, in order to perform the isolated voltage measurement, the voltage probe 400 is connected to a measuring instrument 410, which includes an isolated circuit. In this case, the whole of the voltage probe 400 is the floating side.

The probe head 401 includes a positive lead and a negative lead for picking up a signal. The positive lead includes a resistance R1 having a resistance value r1 and a capacitor C1 having a capacitance c1, and the resistance R1 and the capacitor C1 are connected in parallel. Thus, the voltage probe 400 has an unbalanced circuit configuration. In order to reduce a load effect, the resistance R1 has a high resistance value of some M Ω. Accordingly, a characteristic of the voltage probe 400 is apt to be affected by a capacitance component.

The positive lead is connected to an inner conductor of the coaxial cable 402. The negative lead is connected to an outer conductor of the coaxial cable 402. The coaxial cable 402 is connected to input terminals of the measuring instrument 410 via the connector 403. Assume that there exist an input resistance R2 having a resistance value r2 and an input capacitor Ci having an input capacitance ci between the input terminals of the measuring instrument 410.

For the purpose of adjustment, at least one of c1 and ci is a variable capacitance. A voltage division ratio of the voltage probe 400 is determined by $r2/(r1+r2)$. In order to achieve a flat frequency characteristic, c1 or ci is adjusted so that a voltage division ratio obtained by the capacitors is identical to a voltage division ratio obtained by the resistances. Specifically, c1 or ci is adjusted so that $r2/(r1+r2)=c1/(c1+c2)$, that is, $r1c1=r2 \cdot c2$, where $c2=cc+ci$.

Assume that c1 is adjustable. In this case, the capacitance c2 is a capacitance obtained by physically adding up the capacitance cc of the coaxial cable 402 and the input capacitance ci of the measuring instrument 410. Based on the capacitance c2 and the voltage division ratio achieved by the resistances, c1 is determined.

The voltage division ratio of the voltage probe 400 is generally not less than 10:1, and accordingly $c1 \ll c2$. Thus, the input capacitance viewed from the positive lead is nearly c1. The load effect is reduced as the input capacitance is reduced. Thus, reducing the input capacitance c1 by increasing the voltage division ratio or reducing the capacitance of the coaxial cable 402 results in a reduction in the load effect.

However, increasing the voltage division ratio results in the necessity to configure the measuring instrument 410 to have a highly sensitivity. Thus, increasing the voltage division ratio is not easy. Meanwhile, reducing the capacitance of the coaxial cable 402 results in a reduction in length of the coaxial cable 402, so that convenience is impaired.

Meanwhile, JP-UM-B-6-22217 discloses a voltage probe 440 including an isolated circuit 443, as those shown in FIG. 5. The voltage probe 440 includes a probe head 441, an impedance circuit 442, and the isolated circuit 443. While the voltage probe 440 is in use, the voltage probe 440 is connected to a measuring instrument 450. In this case, a part from the isolated circuit 443 to the probe head 441 is the floating side.

The impedance circuit 442 is used for waveform compensation and voltage division of the voltage probe 440 itself. The impedance circuit 442 includes a positive lead, a coil, and two resistances. The coil and the two resistances are connected in series via the positive lead. A connection point between the resistances is connected with a negative lead via a capacitor.

SUMMARY

An isolated voltage probe includes: a conductor including a positive lead, a negative lead, and a resistance via which the positive lead and the negative lead are connected to each other; a magnetic sensor for measuring a magnetic field in a non-contact manner, the magnetic field being generated by a current flowing through the conductor; and a coaxial cable for transmitting a signal that is based on an output supplied from the magnetic sensor.

DESCRIPTION OF THE EMBODIMENTS

Figure 1:
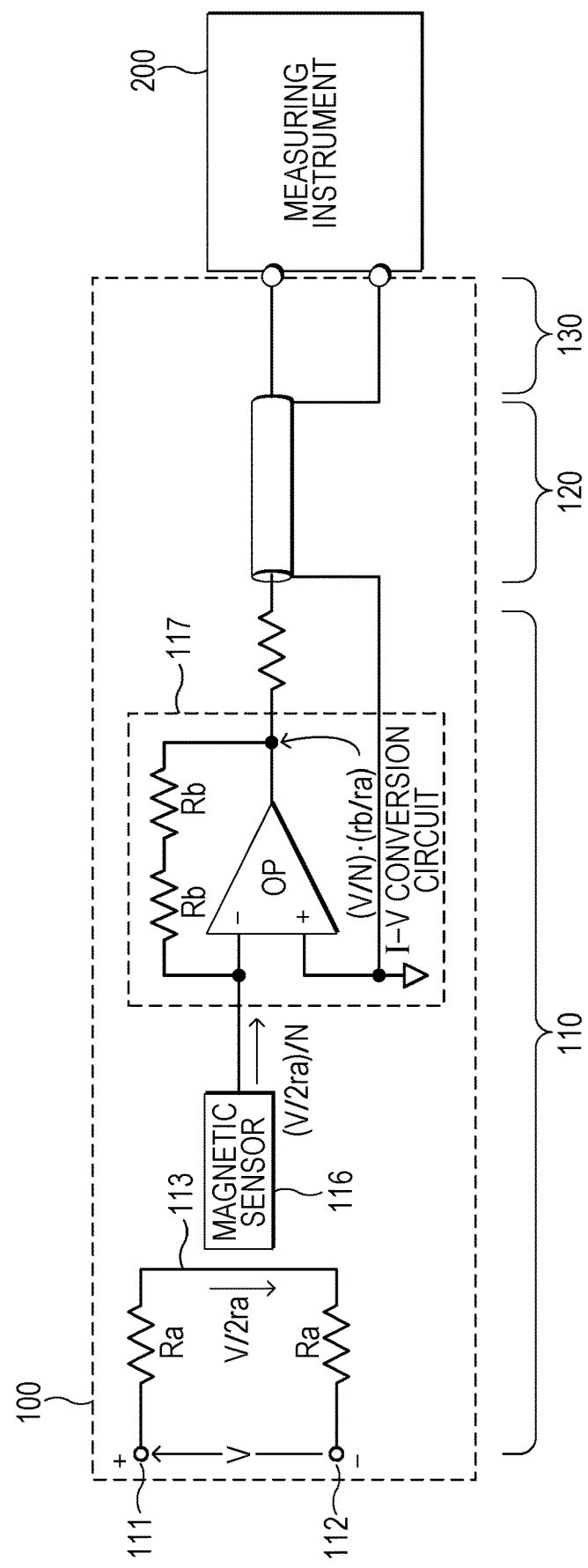
FIG. 1 illustrates a configuration of a voltage probe according to an embodiment of the present disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The IMRR characteristic of the isolated measurement system has the following feature. That is, a characteristic of a part of the system exhibiting a poorest characteristic appears as a characteristic of the whole of the system. Therefore, no matter how excellent characteristic the isolated circuit achieves, the IMRR characteristic of the isolated measurement system is determined depending on the characteristic of the voltage probe if the characteristic of the voltage probe does not correspond to such an excellent characteristic.

Figure 6:
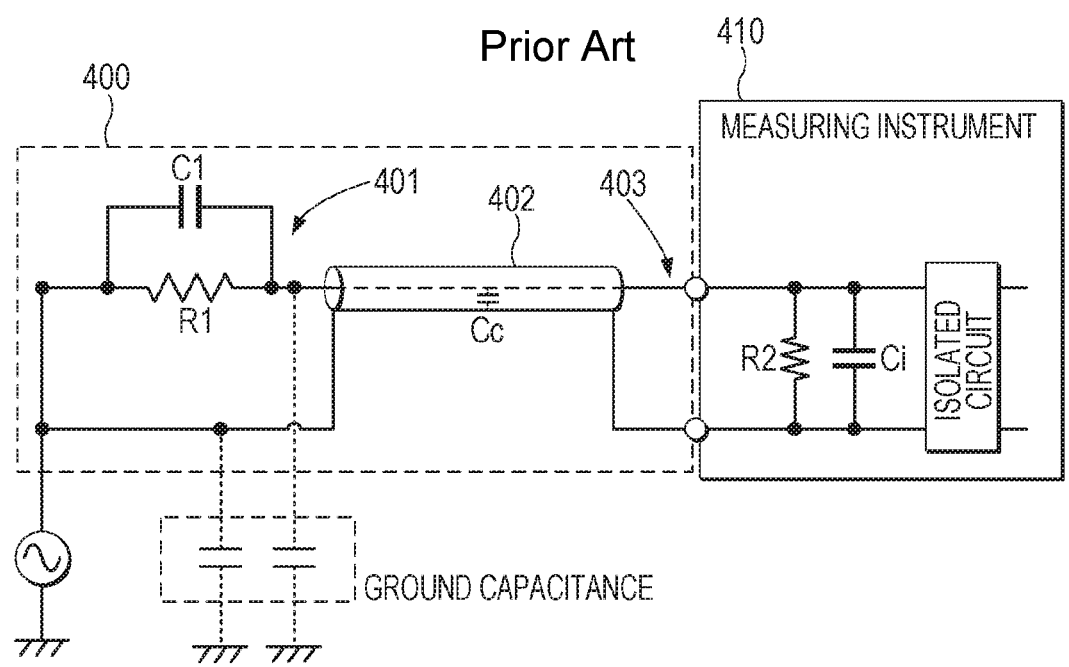
FIG. 6 is a diagram for explaining impairment of IMRR caused by an effect of a ground capacitance.

As shown in FIG. 6, according to the voltage probe 400, the negative lead does not include a resistance component. Therefore, the negative lead is not affected by a ground capacitance. However, the positive lead includes the resistance R1 and a ground capacitance (a parasitic capacitance between a signal path and the ground), which form a low-pass filter. Therefore, the positive lead has a frequency characteristic.

This leads to an unbalance transmission characteristic between the positive lead and the negative lead. Thus, even when identical signals are inputted to the positive lead and the negative lead, an output signal appears. This signal is a component that is originally unnecessary and should be removed.

Figure 5:
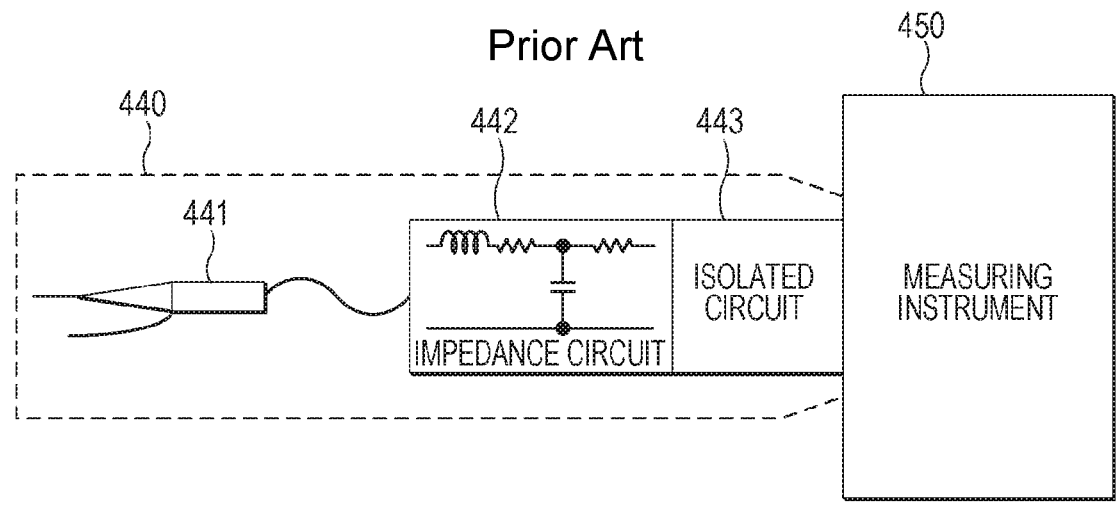
FIG. 5 illustrates a configuration of an isolated voltage probe according to a related art.

As described above, in the case where the floating side includes the unbalanced circuit, the IMRR characteristic is impaired by the effect of the ground capacitance. According to the voltage probe 440 (shown in FIG. 5) including the isolated circuit 443, since the impedance circuit 442, which is in the floating side, is an unbalanced circuit, the IMRR characteristic is impaired by the effect of the ground capacitance.

An object of the present disclosure is to provide an isolated voltage probe that has an excellent isolation mode rejection ratio.

An isolated voltage probe according to an aspect of the present disclosure includes: a conductor including a positive lead, a negative lead, and a resistance via which the positive lead and the negative lead are connected to each other; a magnetic sensor for measuring a magnetic field in a non-contact manner, the magnetic field being generated by a current flowing through the conductor; and a coaxial cable for transmitting a signal that is based on an output supplied from the magnetic sensor.

In this aspect, the magnetic sensor may output a current corresponding to the magnetic field, and the isolated voltage probe may further includes an I-V conversion circuit (current-to-voltage conversion circuit) for converting, into a voltage, the current output from the magnetic sensor and causing the coaxial cable to transmit the voltage.

The resistance may include two resistance elements having identical characteristics.

According to the above aspect of the present disclosure, an isolated voltage probe that has an excellent isolation mode rejection ratio is provided.

With reference to the drawings, the following describes embodiments of the present disclosure. FIG. 1 illustrates a configuration of a voltage probe 100 according to an embodiment of the present disclosure. As shown in FIG. 1, the voltage probe 100 includes a probe head 110, a coaxial cable 120, and a connector 130. As will be described later, the probe head 110 has an isolated configuration. Therefore, a measuring instrument 200, which is to be connected to the probe head 110, does not need to include an isolated circuit.

The probe head 110 includes a conductor 113, a magnetic sensor 116, and an I-V conversion circuit 117. The conductor 113 includes a positive lead 111, a negative lead 112, and two resistance elements Ra. The two resistance elements Ra have identical characteristics, and each have a resistance value ra. The two resistance elements Ra are connected in series between the positive lead 111 and the negative lead 112. In order to reduce the load effect, the resistance value ra of each resistance element Ra is set to be adequately large. Through the conductor 113, which is a path from the positive lead 111 to the negative lead 112, a current expressed by V/2ra flows, where V denotes a measurement voltage measured between the leads.

The magnetic sensor 116 detects, in a non-contact manner, a magnetic field generated by the current V/2ra that flows through the conductor 113. The magnetic sensor 116 outputs a current (an output supplied from the magnetic sensor 116) having a value corresponding to the magnetic field (a strength of the magnetic field). The output current supplied from the magnetic sensor 116 is expressed by (V/2ra)/N.

The I-V conversion circuit 117 converts, into a voltage (voltage signal), the current (current signal) output from the magnetic sensor 116. The I-V conversion circuit 117 causes the coaxial cable 120 to transmit the voltage signal (the signal that is based on the output (output signal) supplied from the magnetic sensor 116). Namely, the I-V conversion circuit 117 drives the coaxial cable 120, which is connected thereto via a resistance. The coaxial cable 120 transmits the voltage signal (the signal that is based on the output supplied from the magnetic sensor 116) supplied from the I-V conversion circuit 117.

In the example shown in FIG. 1, the I-V conversion circuit 117 includes an operation amplifier OP. The I-V conversion circuit 117 performs negative feedback by which the output voltage is returned to an inverting input terminal via two resistance elements Rb that are connected in series. An output terminal of the operation amplifier OP is connected to an inner conductor of the coaxial cable 120. A non-inverting input terminal of the operation amplifier OP is connected to an outer conductor of the coaxial cable 120. In this case, an output voltage of the I-V conversion circuit 117 is expressed by (V/N)·(rb/ra). In a case of rb=ra, the output voltage is expressed by V/N.

The conductor 113 and the magnetic sensor 116 are not in contact with each other, and are electrically isolated from each other. Thus, the conductor 113 including the positive lead 111, the negative lead 112, and the two resistance elements Ra is the floating side. Since the conductor 113 is the floating side in the isolated voltage measurement, the conductor 113 does not need a ground lead.

Here, the floating side (conductor 113) of the voltage probe 100 includes a balanced circuit including the two resistance elements via which the positive lead 111 and the negative lead 112 are connected. Thus, it is possible to suppress or reduce impairment in the IMRR characteristic that may be caused by an effect of a ground capacitance. Furthermore, whereas the floating side (conductor 113) includes the resistance elements, the floating side (conductor 113) does not include a capacitor (capacitance). Thus, it is possible to suppress or reduce the load effect.

Figure 2:
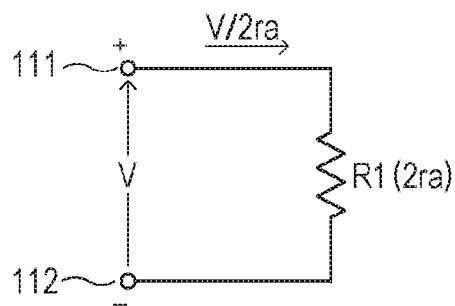
FIG. 2 illustrates a conductor including a single resistance.

The conductor 113 is illustrated to include the two resistance elements Ra, for the purpose of emphasizing that the conductor 113 includes the balanced circuit. In actual implementation, as shown in FIG. 2, the conductor 113 may include a resistance R1 having a resistance value 2ra, instead of the two resistance elements Ra. Similarly, the I-V conversion circuit 117 may include a resistance R2 having a resistance value 2rb, instead of the two resistance elements Rb.

A positional relationship between the conductor 113 and the magnetic sensor 116 will be described. For example, the magnetic sensor 116 may be disposed in the vicinity of the conductor 113. Alternatively, the magnetic sensor 116 (e.g., a Rogowski sensor) having a flexible shape may be wound around the conductor 113 in a non-contact manner.

Figure 3:
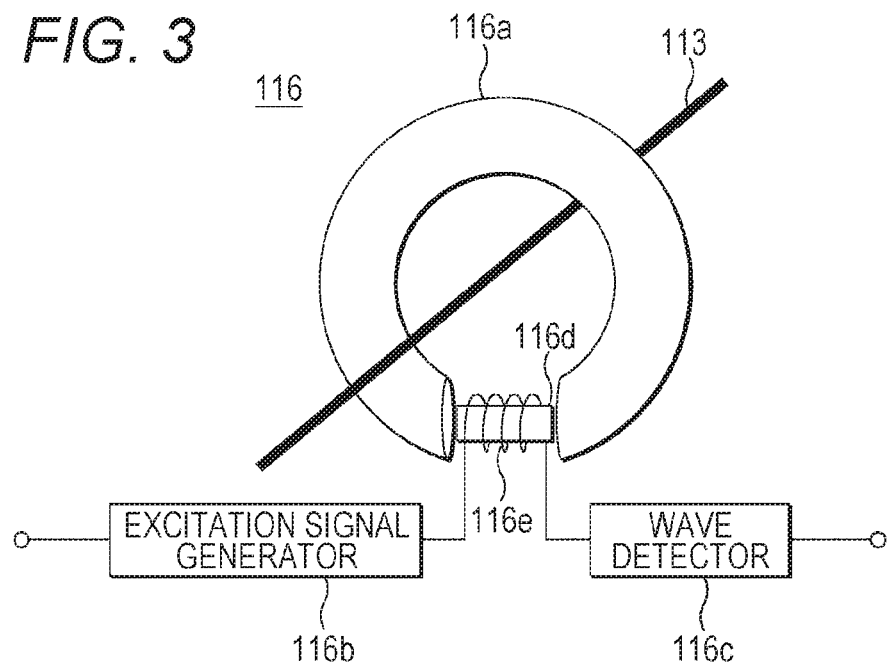
FIG. 3 illustrates a flux-gate magnetic sensor.
Figure 4:
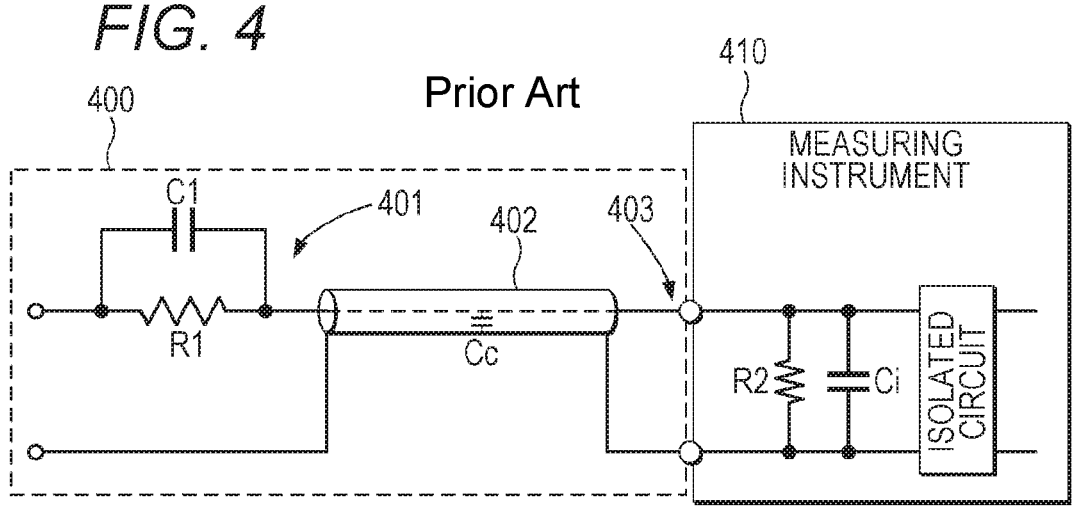
FIG. 4 illustrates a configuration of a voltage probe according to a related art.

Further alternatively, as shown in FIG. 3, the magnetic sensor 116 may include a magnetic core 116a surrounding the conductor 113. In this configuration, the magnetic sensor 116 may collect and detect a magnetic flux generated by a current. In the configuration shown in FIG. 3, the magnetic sensor 116 includes an excitation signal generator 116b and a wave detector 116c. The excitation signal generator 116b and the wave detector 116c are connected to each other via an exciting coil 116e, which is wound around a magnetic material 116d. Namely, the magnetic sensor 116 illustrated in FIG. 3 as an example is a flux-gate magnetic sensor.

In the above-described example, the magnetic sensor 116 is configured to output a current having a value corresponding to a magnetic field. Alternatively, the magnetic sensor 116 may be configured to have an ability to output a voltage having a value corresponding to a magnetic field and to drive the coaxial cable 120. In this case, the probe head 110 may not include the I-V conversion circuit 117. Furthermore, even with the magnetic sensor 116 configured to output a current having a value corresponding to a magnetic field, the probe head 110 does not need to include the I-V conversion circuit 117 if the measuring instrument 200 is configured to input a current.

The technique according to the present disclosure relates to an isolated voltage probe, especially to an isolated voltage probe that has an excellent isolation mode rejection ratio.

The I-V conversion circuit 117 may use the operation amplifier OP and perform the negative feedback of an output voltage with the two resistance elements Rb, which are connected in series.

Embodiments of the present disclosure may be first to third isolated voltage probes below.

The first isolated voltage probe includes: a conductor constituted by a positive lead and a negative lead that are connected to each other via a resistance; a magnetic sensor for measuring a magnetic field in a non-contact manner, the magnetic field being generated by a current flowing through the conductor; and a coaxial cable for transmitting a signal that is based on an output supplied from the magnetic sensor.

The second isolated voltage probe is the first isolated voltage probe configured such that: the magnetic sensor outputs a current corresponding to the magnetic field; and the second isolated voltage probe further includes an I-V conversion circuit for converting, into a voltage, the current output from the magnetic sensor and causing the coaxial cable to transmit the voltage.

The third isolated voltage probe is the first or second isolated voltage probe configured such that the resistance is constituted by two resistance elements having identical characteristics.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. An isolated voltage probe comprising:
   a probe head comprising:
      a conductor including a positive lead, a negative lead, and a first resistance element (Ra) via which the positive lead and the negative lead are connected to each other; and
      a magnetic sensor, electrically isolated from the conductor, for measuring a magnetic field in a non-contact manner, the magnetic field being generated by a current flowing through the conductor; and
   a coaxial cable for transmitting a signal that is based on an output supplied from the magnetic sensor,
   wherein the positive lead and negative lead are configured to pick up a signal to be measured, and
   wherein a pair of the positive lead and the negative lead forms a balanced circuit without including an electrical component having a frequency characteristic.

2. The isolated voltage probe according to claim 1,
   wherein the magnetic sensor outputs a current corresponding to the magnetic field, and
   wherein the isolated voltage probe further comprises a current-to-voltage conversion circuit that converts, into a voltage, the current output from the magnetic sensor and causes the coaxial cable to transmit the voltage.

3. The isolated voltage probe according to claim 1,
   wherein the resistance element includes two resistance elements connected in series between the positive lead and the negative lead and having identical characteristics.

4. The isolated voltage probe according to claim 2,
   wherein the resistance element includes two resistance elements connected in series between the positive lead and the negative lead and having identical characteristics.

5. The isolated voltage probe according to claim 1, wherein the resistance element comprises at least one resistor connected in series between the positive lead and the negative lead.

6. The isolated voltage probe according to claim 1, wherein the electrical component comprises a capacitive component.

7. The isolated voltage probe according to claim 2, wherein the signal is generated by converting current output from the magnetic sensor into a voltage signal by the current-to-voltage conversion circuit, and
   wherein the current-to-voltage conversion circuit includes an operational amplifier, and both an inverting input terminal and an output terminal of the operational amplifier are connected with each other through a second resistance element (Rb), and the output terminal is connected to an inner conductor of the coaxial cable, and a non-inverting input terminal of the operational amplifier is connected to an outer conductor of the coaxial cable.

8. An isolated voltage probe comprising:
   a probe head comprising:
      a conductor including a positive lead, a negative lead and a first resistance element (Ra) via which the positive lead and the negative lead are connected to each other;
      a magnetic sensor, electrically isolated from the conductor, for measuring, in a non-contact manner, a magnetic field generated by a first current flowing through the conductor, and for outputting a second current corresponding to the first current;
      an I-V conversion circuit that converts the second current into a voltage signal, the I-V conversion circuit including an operational amplifier having an inverting input terminal and an output terminal connected with each other through a second resistance element (Rb); and
   a coaxial cable including a pair of an inner conductor and an outer conductor coaxially provided for transmitting the voltage signal having been converted at the I-V conversion circuit, the inner conductor being connected to the output terminal of the operation amplifier, and the outer conductor being connected to a non-inverting input terminal of the operational amplifier;
   wherein the positive lead and negative lead are configured to pick up a signal to be measured,
   wherein a pair of the positive lead and the negative lead forms a balanced circuit without including an electrical component having a frequency characteristic, and
   wherein the voltage signal generated at the I-V conversion circuit is transmitted to an external measurement instrument in which the signal to be measured is processed.

* * * * *